(12) United States Patent
Debije et al.

(10) Patent No.: US 8,927,856 B2
(45) Date of Patent: Jan. 6, 2015

(54) OPTICAL DEVICE WITH ANISOTROPIC LUMINESCENT MATERIAL

(75) Inventors: Michael George Debije, Den Haag (NL); Casper Laurens Oosten Van, Eindhoven (NL); Cornelis Wilhelmus Maria Bastiaansen, Montfort (NL)

(73) Assignee: Peer+B.V., Eindhoven (NL)

( * ) Notice: Subject to any disclaimer, the term of this patent is extended or adjusted under 35 U.S.C. 154(b) by 609 days.

(21) Appl. No.: 12/991,135

(22) PCT Filed: May 18, 2009

(86) PCT No.: PCT/EP2009/055971
§ 371 (c)(1),
(2), (4) Date: Nov. 5, 2010

(87) PCT Pub. No.: WO2009/141295
PCT Pub. Date: Nov. 26, 2009

(65) Prior Publication Data
US 2011/0094585 A1 Apr. 28, 2011

(30) Foreign Application Priority Data

May 21, 2008 (EP) .................... 08156701

(51) Int. Cl.
| | | |
|---|---|---|
| H01L 31/055 | (2014.01) | |
| C09K 19/58 | (2006.01) | |
| C09K 19/60 | (2006.01) | |
| F24J 2/40 | (2006.01) | |
| G02F 1/137 | (2006.01) | |
| G02F 1/133 | (2006.01) | |

(52) U.S. Cl.
CPC .............. *C09K 19/588* (2013.01); *C09K 19/60* (2013.01); *F24J 2/407* (2013.01); *G02F 1/13762* (2013.01); *H01L 31/055* (2013.01); *C09K 19/606* (2013.01); *G02F 2001/13324* (2013.01); *G02F 2203/023* (2013.01); *Y02E 10/40* (2013.01); *Y02E 10/50* (2013.01)
USPC ........... 136/257; 136/246; 136/254; 136/256; 136/259

(58) Field of Classification Search
CPC .............. H01L 31/0522; H01L 31/055; H01L 51/5012; G02F 1/01; G02F 1/13762; G02F 2001/13324; G02F 2203/023; Y02B 10/10; Y02E 10/40; Y02E 10/52
USPC .................................................. 136/243–293
See application file for complete search history.

(56) References Cited

U.S. PATENT DOCUMENTS

2007/0273265 A1 11/2007 Hikmet
2009/0301546 A1* 12/2009 Sinsabaugh ................... 136/246

FOREIGN PATENT DOCUMENTS

| DE | 3125620 A1 | 1/1983 |
|---|---|---|
| JP | 6-318766 | 11/1994 |
| WO | WO2006/088369 A2 | 8/2006 |

OTHER PUBLICATIONS

Dierking; "Dielectric breakdown in liquid crystals;" *J. Phys. D. Appl. Phys.*; 2001; pp. 806-813; vol. 34; Institute of Physics Publishing.

*Primary Examiner* — Thanh-Truc Trinh
(74) *Attorney, Agent, or Firm* — Oliff PLC (57) ABSTRACT

An optical device (1) is provided. The optical device comprising a switchable layer (2) at least one alignment layer (6) a light guiding system (5), whereas the switchable layer (2) comprises a luminescent material (3) for absorbing and emitting light, whereby the alignment of the luminescent material (3) is changeable and the light guiding system (5) guides the emitted light, whereby the switchable layer (2) is in contact with the at least one alignment layer (6) and the luminescent material (3) exhibits anisotropic properties, whereby the optical device (1) comprises a light energy-converting means (7), wherein the light guiding system (5) is in physical contact with the energy converting means (7).

11 Claims, 10 Drawing Sheets

OPTICAL DEVICE WITH ANISOTROPIC LUMINESCENT MATERIAL

The invention pertains to an optical device.

Optical devices are well known in the prior art. Document DE 33 30 305 A1, for example, discloses a window with a liquid crystalline layer, wherein the alignment of the switchable layer depends on a supplied voltage. In one embodiment the switchable layer is made of liquid crystals dye. Optical devices with a fluorescent layer are also well known in the prior art. Document DE 31 25 620 A1 for example discloses a window with a fluorescent layer. Light emitted by the fluorescent layer is guided via total internal reflection to a photovoltaic cell. In document WO 2006/088369 A2 a luminescent material with photoluminescent material molecules and cholesteric layers is disclosed. The photoluminescent material molecules are statically aligned in a separate layer.

Regarding the prior art the optical devices are constructed in a complex manner and a plurality of layers is needed for light absorbing and guiding. A further disadvantage is that the amount of light absorbed by the luminescent material is not controllable or laboriously controllable.

It is a general object of this invention to provide an optical device for light absorbing and guiding, whereas the light absorption is reliably controllable.

Therefore the object of the invention is an optical device comprising:
  a switchable layer;
  at least one alignment layer
  a light guiding system
whereas the switchable layer comprises a luminescent material for absorbing and emitting light, whereby the alignment of the luminescent material is changeable and the light guiding system guides the light, whereby the switchable layer is in contact with the at least one alignment layer and the luminescent material exhibits anisotropic properties and whereas the optical device comprise a light energy-converting means, wherein the light guiding system is in physical contact with the energy converting means.

Document JP 06 318766 A discloses a laser oscillator with a liquid crystal and an organic fluorescent material. Inside the laser oscillator light is guided between mirror surfaces, whereby the light exits on one of this surfaces. In Document US 2007/0273265 A1 a light-emitting device is disclosed. The device exhibits a LED and a kind of light guiding system. In the paper "Anisotropic fluorophors for liquid crystal displays" (Displays, October 1986, p. 155-160) a light guiding system for displays is disclosed, whereby the display is a liquid crystal display. In none of these documents is the guided light converted into another form of energy by a converting system.

Due to the fact that the switchable layer comprises the luminescent material no additional layer for the luminescent material is necessary. Therefore, the optical device can be constructed in a compact way and the manufacture is simple, inexpensive and time-saving. Furthermore, the anisotropic properties of the luminescent material result in a controllable absorption rate without a complex mechanism.

The term 'switchable layer' refers to a layer that is capable of switching the alignment of the luminescent material. In one preferred embodiment, the alignment of the luminescent material is switched using an electrical signal. In an alternative embodiment, the alignment of the luminescent material switches with the intensity of light over a certain wavelength that is irradiated upon the optical device. For the sake of clarity, the term 'switchable layer' refers to a material selected from a group consisting of a liquid, a gel or a rubber and/or combinations thereof. If a liquid is used as the switchable layer, preferably a liquid crystal is used. The liquid crystal can be a thermotropic or a lyotropic. Preferably, the liquid crystal is a thermotropic liquid crystal. The liquid crystal dissolves and aligns the luminescent material, a so-called guest-host system. The liquid crystal is preferably in its nematic phase under all working temperatures. Furthermore, the liquid crystal has preferably anisotropic dielectric properties and can thus be aligned using an electric field. Preferably, the liquid crystal can be a rod-like and/or a discotic liquid crystal and can exhibit various molecular constitutions, for example uniaxial planar, homeotropic uniaxial, twisted nematic, splayed or cholesteric. When the switchable layer is a gel or a rubber, the gel is preferably a liquid crystalline gel or the rubber a liquid crystalline rubber. The gel or rubber has preferably mesogenic groups with a dielectric anisotropy, such that the alignment of these groups can be controlled using an electrical field. Both for the gel and the rubber, the chemical crosslinking between the mesogenic groups is low enough to permit sufficient mobility to allow switching using the electrical field. In one embodiment, the gel or rubber allows the luminescent material to be dissolved in the gel or rubber, and acts as a guest-host system for the luminescent material. Alternatively, the luminescent material is chemically linked to the liquid crystal rubber or gel.

The alignment layer is preferably directly in contact with the top and/or the bottom of the switchable layer. The top and bottom of the switchable layer means that the surfaces of the switchable layer are parallel to the main extension plane of the switchable layer. Directly means that the alignment layer is in physical contact with the switchable layer. With alignment layer, it is preferably referred to a layer that is capable of inducing alignment of the luminescent material. Preferably, the alignment layer is a double layer of containing a polyimide layer on an electrode or a single photoresponsive command surface. The polyimide layer can be a buffed, rubbed, or non-buffed or non-rubbed polyimide layer. In case the alignment layer is a double layer of polyimide on an electrode, the polyimide layer is a thin layer with a thickness between 20 nm and 400 nm, more preferably between 30 nm and 300 nm and most preferably between 50 nm and 200 nm. More preferably, two double layers of polyimide on electrodes as alignment layers are used, whereby each double layer is stacked such that the polyimide layer of the double layer structure is located closest to the switchable layer. In a preferable embodiment the electrodes exhibit transparent properties. Preferably the two electrodes can be located on either top and bottom side of the switchable layer, or as in-plane patterned electrodes on one side of the switchable layer, whereby a voltage can be applied to the optical device by means of the electrodes.

In case the alignment layer is a photoresponsive command surface, the alignment of the luminescent material is controlled by the intensities of light of certain wavelength(s) irradiated upon a command surface of the optical device. Preferably, the command surface is controlled by light irradiation between 200 nm and 1000 nm, more preferably between 300 nm and 450 nm. The photoresponsive command surface is a thin layer and can be a self-assembled-monolayer up to a thickness of 50 nm, more preferably up to a thickness of 150 nm and most preferably up to a thickness of 200 nm. The alignment layer preferably uses a photochromic compound that can be an azobenzene, stilbene, cinnamate, α-Hydrazono-β-ketoester, spiropyran, benzylidenephtalimidene or a benzylideneacetophenone.

The term 'luminescent material with anisotropic properties' refers to a substance in which light absorption and emission properties depend on the propagation direction, wavelength and/or the polarization direction of the incident light. The luminescent material is able to absorb light over a specified range of wavelengths of the optical spectrum—preferably the spectrum visible to the human eye. The photonic energy absorbed is, for a large part, again emitted as a photon of a longer wavelength. The propagation directions of the absorbed photon and the emitted photon are not directly coupled to each other. Furthermore, the term luminescent material comprises a luminescent dye or a luminescent quantum dot. The term quantum dot means a semiconducting particle whose excitons are confined in all three spatial directions. It is therefore able to absorb light over a range of wavelengths and emit the absorbed energy as photons over a smaller range of wavelengths.

For better understanding it is also possible that the luminescent material itself comprises the switchable layer: that is, the orientation of the luminescent material may be directly switched by application of an external electric field. In another case, the luminescent material (guest) is supported by an isotropic organized host, such as an isotropic liquid, rubber or gel. In this preferred embodiment the luminescent material has dielectric anisotropic properties and is directly switchable by using the applied voltage. In this latter case, no switchable host, for example a liquid crystal in the switchable layer, is necessary.

The optical device comprises an energy converting system, whereas the light guiding system is in physical contact with the energy converting system. An optical contact between the energy converting system, a medium and the light guiding system means that there is a physical contact. The medium is preferably sandwiched between the light guiding system and the energy converting system. Hence by a physical contact is the light guiding system in physical touch with the medium and the energy converting system is in physical touch with the medium. Furthermore, any intervening media that may separate the light guiding system and the energy converting system, separates them at most by a distance much less than a wavelength of light, so that interference fringes are not formed. Preferably the medium is a very thin, optically transparent adhesive layer, for example Norland Optical Adhesive 71 (Norland Products). The energy converting system converts the light into at least one of the energy forms from the groups heat or electricity. Due to the contact between the light guiding system and the energy converting system, difficult mechanisms for focusing the emitted light on the energy converting system are not necessary. Therefore the optical device is highly reliable and robust.

Preferably the energy converting system is at least one photovoltaic cell and/or a photo-thermal converter. Preferably the energy converting system is an array of photovoltaic cells. As photovoltaic cells any type of photovoltaic cell can be used that absorbs the wavelength of the guided light. For example, the photovoltaic cell could be a silicon wafer based cell, using mono-crystalline, poly-crystalline, or amorphous silicon. Alternatively, the photovoltaic cell could be a thin film photovoltaic cell such as GaAs cells, microcrystalline silicon or cadmium telluride cell. Yet another possibility is to use photovoltaic cells that are built from organic compounds (polymer-based photovoltaics) using organic semiconductors or carbon nanotubes, or to use photovoltaics incorporating quantum dots.

The anisotropic luminescent material exhibits preferably the properties of dichroism. Dichroism properties mean that the luminescent material has a strong absorption along a first axis of the luminescent material—this axis is termed as the absorption axis of the molecule or as absorption axis of the luminescent material. In any other axis of the luminescent material, the absorption is lower. In a preferred embodiment, the luminescent material exhibits a high absorption for light that is polarized such that its electric field vector is parallel to the absorption axis of the luminescent material and exhibits a low absorption for light that is polarized such that its electric field vector is perpendicular to the absorption axis of the luminescent material. The absorption axis of the luminescent material could be the long axis of the luminescent material or any other axis of the luminescent material. The luminescent material is preferably a dye and has preferably fluorescent and/or phosphorescent properties. Moreover composites composed of two or more different luminescent materials are possible.

In one preferred embodiment the luminescent material is a fluorescent dye. Fluorescence is a special kind of luminescence and occurs when energy supplied by electromagnetic radiation causes the conversion of an electron of an atom from a lower energy state into an "excited" higher energy state; the electron then releases this additional energy in the form of light (luminescence) of a longer wavelength when it falls to a lower energy state.

Preferably the light guiding system guides the emitted light via total internal reflection. Total internal reflection occurs when a ray of light strikes a medium boundary at an angle larger than the critical angle with respect to the normal to the surface. If the refractive index is lower on the other side of the boundary no light can pass through, so effectively all of the light is reflected. The critical angle is the angle of incidence above which the total internal reflection occurs. Preferably 100% of the entered light is guided inside the light guiding system.

Preferably the light guiding system comprises at least a first medium as a core of the light guiding system and a second medium as a border of the light guiding system. The refractive index of the first medium is preferably equal to or higher than the refractive index of the second medium and the first medium comprises the luminescent material. Therefore light, emitted by the luminescent material, will be refracted at the boundary surface of the two mediums and—as a result of the higher refractive indexes—is reflected back into the first medium. In a preferred embodiment the refraction at the boundary is a total reflection, so that the emitted light is guided via total internal reflection inside the light guiding system. Advantageously no light intensity is lost during the light guiding process. A solar concentrator and/or optic fibres are examples for a light guiding system. In one preferable embodiment, the light guiding system shows the following construction: a sheet of glass, alignment layer, switchable layer containing anisotropic luminescent material, another alignment layer and another glass sheet. In air, the emitted light in the switchable layer is primarily reflected at the glass-air interface and thereby returns into the light guiding system. Certainly the emitted light can be guided inside the light guiding system by 'normal' reflection. Normal reflection means that the angle of incidence is unequal to the critical angle used for the total reflection. The light guiding system is also referred as wave guiding system in this invention.

The switchable layer is preferably at least on one side attached to supporting means. In a preferred embodiment, the switchable layer is sandwiched between supporting means. In a preferred embodiment the optical device is a window, whereas the supporting means is glass and/or polymer panes. The invention is not restricted to flat planes and includes layers that have been bent, moulded or otherwise shaped. Suitable materials for the panes are largely transparent for the emitted radiation that is conveyed through the waveguide.

Suitable materials include transparent polymers, glass, transparent ceramics and combinations thereof. The glasses may be inorganic glasses that are silica based. The polymers may be (semi-)crystalline or amorphous. Suitable polymers include polymethyl methacrylates, polystyrene, polycarbonate, cyclic olefin copolymers, polyethylene terephtalate, polyether sulphone, cross-linked acrylates, epoxies, urethane, silicone rubbers as well as combinations and copolymers of these polymers. In a preferred embodiment, the glass is float glass that is silica based. Between at least two planes (glass or polymer panes), the switchable layer and the luminescent material are sandwiched. Due to the planes, the switchable layer is protected against mechanical stress and defilements. Therefore the luminescent material is supported and the lifetime of the luminescent material increased. In a special embodiment of the invention the sheet glass is dyed or an extra dyed layer between the sheet glass and the luminescent material is destined. The dyed sheet glass or the extra dyed layer protects the luminescent material against UVA- and/or UVB radiations and/or specific wavelengths, which could be detrimental to the luminescent material.

It is preferred that the supporting means are panel shaped and the energy converting system is arranged on at least one side of the supporting means and perpendicular to the main extension plane of the supporting means. Therefore, the position of the energy converting system is inconspicuous. If the optical device is a window, the energy converting system is preferably arranged in the window frame and invisible for a viewer.

Preferably the optical device exhibits light absorbing and/or light transparent properties. Furthermore, the ratio between absorbed light and passed light preferably depends on the applied voltage. For example, after applying a certain voltage the optical device is primarily transparent for light, and after applying a different voltage, the optical device is primarily opaque. To change the properties of the optical device different voltages or different kinds of voltage profiles—for example a saw-tooth voltage, square wave voltage or trapezoidal voltage—can be used. In addition, different amplitudes, wavelength or frequencies can also alter the properties of the optical device.

To achieve the opaque and transparent properties the alignment of the luminescent material in the switchable layer is preferably changeable with respect to the main extension plane of the switchable layer. Since the luminescent material exhibits anisotropic properties, the absorption of the luminescent material changes with the alignment of the luminescent material with respect to the incident light radiation. For a primarily transmitting optical device, for example, the absorption axis of the luminescent material may be arranged perpendicular to the main extension plane of the switchable layer. Therefore, the absorption axis of the luminescent material is perpendicular to the polarization direction of the electric field vector of the incoming light and less light is absorbed by the luminescent material. In this case, most light passes through the optical device—the transparency of the optical device is high and the absorption is low. In this case the luminescent material is at least aligned in a transmitting state. Conversely, the luminescent material can be arranged in a way such that less light is able to pass trough the luminescent material. For a higher absorbing optical device the absorption axis of the luminescent material is preferably arranged parallel to the main extension plane of the switchable layer and parallel to the polarization direction of the electric field vector of the incoming light. Therefore, more light is absorbed, emitted and guided to the energy-converting means and the energy-converting rate is comparatively higher than in the transmitting state. In this case the luminescent material is at least aligned in an absorbing state. To establish understanding the absorbed light is preferably sunlight, whereby all polarization directions are preferably in equipartition. The absorption band of the luminescent material covers a part of the solar spectrum. To classify the opaque and transparent properties of the optical device the optical density can be used. The density is a unitless measure of the transmittance of an optical element for a given length and wavelength $\lambda$ and calculated according to the following formula:

$$OD_\lambda = \log_{10} O = -\log_{10} T = -\log_{10}\left(\frac{I}{I_0}\right)$$

whereas
O is the opacity
T is the transmittance
$I_0$ is the intensity of the incident light beam
I is the intensity of the transmitted light beam Therefore, the higher the optical density, and thus the opacity, the lower the transmittance.

In a preferred embodiment the luminescent material is aligned in at least one of the scattering states. Preferably the luminescent material adopts the scattering state, when the luminescent material switches bidirectional between the absorbing state and the transmitting state. Therefore, it is preferred that a plurality of scattering states exist, as there are a plurality of positions between the transmitting state and the absorbing state.

If a liquid crystal is used as switchable host the luminescent material will be embedded in the liquid crystals: as a consequence of the movement of the liquid crystals the luminescent material also moves. In a liquid crystal gel or liquid crystal rubber, a limited amount of motion of the mesogenic groups is still allowed. The luminescent material is embedded in the mesogenic groups and as a consequence of the movement of the crystals, the luminescent material also moves.

In the transmitting position, preferably most of the incident light passes through the optical device—the optical density is low. In the absorbing state most of the incoming light is absorbed by the luminescent material, therefore the optical density is high.

In the scattering state the external light that is incident on the optical device leaves the optical device in random directions. In one preferred embodiment, where the switchable layer contains a liquid crystal host, the liquid crystal is organized as an in-plane cholesteric ordering or in a multi-domain fashion. This organization of the liquid crystal causes variations in the refractive index over short distances within the switchable layer, thereby causing the light to be scattered.

It is preferred that in all positions of the luminescent material, incoming light is absorbed and emitted by the luminescent material. The amount of absorbed light depends on the alignment of the luminescent material. Preferably the absorbed light is emitted in a light guiding mode of the light guiding system and the light guiding system guides the light to the energy converting system via total internal reflection. By the use of the light guiding system light can be transported almost completely without losses. Therefore the position for the energy converting system is independent of the position of the luminescent material. Distances between the luminescent material and energy converting system are therefore of minimal importance.

Preferably the absorption axis of the luminescent material is arranged perpendicular or approximately perpendicular to the main extension plane of the switchable layer in the transmitting state. This means that any light transmitted through the window at a normal angle with the window pane, is poorly absorbed by the luminescent material. Furthermore, it is preferred that the absorption axis of the luminescent material is arranged parallel or approximately parallel to the main extension plane of the switchable layer in the absorbing state. For better understanding a plurality of positions with different degree of opacity and/or transparency can exist, because all positions of the absorption axis of the luminescent material between exactly parallel and exactly perpendicular with respect to the main extension plane of the switching layer can be achieved. It should be noted, that a completely 90° (perpendicular) or a completely 0° (parallel) orientation of the luminescent material with respect to the main extension plane of the switchable layer is hardly attainable. In the majority of cases most of the luminescent material is aligned in the range of 90° with respect to the main extension plane of the switchable layer in the transmitting state and in the range of 0° with respect to the main extension plane of the switchable layer in the absorption state.

In the scattering state the absorption axis of the luminescent material is preferably arranged in an alternating or random fashion between the parallel and perpendicular alignment. In a preferred embodiment the luminescent material and/or host attains the scattering state in a stable, intermediate state, when the luminescent material transfers from the transmitting state to the absorbing state and its reverse.

In a preferred embodiment the optical device comprises at least one wavelength-selective mirror. Preferably the light guiding system comprises the wavelength-selective mirror. In this preferred embodiment, more of the emitted light is trapped inside the light guiding system by applying wavelength selective mirrors on one or two sides of the main extension plane of the light guiding system. The wavelength-selective mirror is preferably an inorganic or an organic wavelength-selective mirror and/or the wavelength-selective mirror is preferably at least 50% transparent to light absorbed by the luminescent material and at least 50% reflective to non-polarized radiation that is emitted by the luminescent material. In some cases, it can be beneficial to add the wavelength selective mirror to one or two sides of the optical device and/or on the top (top-side) and the bottom (bottom-side) of the switchable layer in respect to the main extension plane of the switchable layer. The efficiency with which the optical device is capable of transporting emitted light to the energy converting system, amongst other, depends on the capacity of the optical device to capture emitted light inside the light guiding mode. The capacity to selectively allow light into the device and to prevent another wavelength of light from exiting the device can increase the amount of light that is guided to the energy converting system. In that case, the reflecting wavelength of the wavelength selective mirror is chosen such that it is at longer wavelengths than the absorption band of the luminescent material, but such that the emitted light is at a longer wavelength than the absorbed light, is mostly reflected by the wavelength selective mirror. In one preferred embodiment, the wavelength selective mirror can be created using a cholesteric liquid crystal film. A cholesteric liquid crystal film reflects a maximum of 50% of light at a certain wavelengths because the periodic modulation in refractive index causes Bragg reflection. The width of the reflection band depends on the cholesteric pitch and the birefringence of the liquid crystal. A combination of a right-handed cholesteric layer and a left-handed cholesteric layer can yield a full reflecting mirror for a specific range of wavelengths. Alternatively, two cholesteric layers with the same handedness with a half wave retardation layer in between can be used to obtain a full reflecting mirror for a specific range of wavelengths.

In a preferred embodiment the polymeric wavelength selective mirror comprises one or more cholesteric layers reflecting right-handed circularly polarized light or one or more cholesteric layers reflecting left-handed circularly polarized light or comprises both one or more cholesteric layers reflecting right-handed circularly polarized light and one or more cholesteric layers reflecting left-handed circularly polarized light or comprises one or more cholesteric layers reflecting light of the same handedness in combination with a halfwave plate.

A further object of the invention is a method for transmission of light through the optical device, whereby the luminescent material is preferably transferred from the absorbing state to the transmitting state or vice versa by applying an electrical potential with the amplitude A1, an electrical field V1 and/or intensity of light of a specific wavelength $\lambda 1$ respectively a specific frequency f1.

Preferably the luminescent material is transferred in the scattering state by applying an electrical potential with the amplitude A2, an electrical field V2, and/or an intensity of light of a specific wavelength $\lambda 2$ respectively a specific frequency f2, whereas the amplitudes A1 and A2, the electrical fields V1 and V2 and/or the intensities of the light with the specific wavelengths $\lambda 1$ and $\lambda 2$ respectively the specific frequencies f1 and f2 are different from each other.

In one preferred embodiment where a polyimide layer with electrodes is used as alignment layer, the application of electrical signal S1 brings the switchable layer in position 1 (for example a transmitting state), and the application of electrical signal S2 brings the switchable layer to position 2 (for example a absorption state). For effective use, it is understood that the amplitude and/or frequency value of signal S1 and S2 are different.

In one preferred embodiment, a third electronic signal S3 is applied to attain the scattering state of the switchable layer, wherein the amplitude and/or frequency content of the signal S3 is different from signals S1 and S2.

In one preferred embodiment, the optical device has at least two stable states. A stable state refers to alignment configurations of the luminescent material that can be kept during a prolonged period of time without applying a stimulus, where this stimulus can be an electrical signal or an optical signal. In case a third position is desired, a tri-stable system is also possible. In one preferred embodiment, the stable states are created using a liquid crystalline host as switchable layer. In this preferred embodiment, the stable states of the liquid crystals are obtained by creating a local minimum in the free energy of the system. In order to switch to another configuration, the liquid crystals have to reorganize themselves, which causes an energy barrier that can only be overcome by supplying an external stimulus. This external stimulus can be an electrical field or command surface, acting as alignment layer.

Preferably the optical device can be used for windows, vehicles, buildings, greenhouses, eyeglasses, safety glass, optical instruments, sound barriers and/or medical instruments. In these above-mentioned applications at least the switchable layer, the supporting means, the light guiding system and the alignment layer preferably substitutes the sheet glass. Safety glass in terms of the invention is special glass, which can be switchably clouded. Such glass for example can be used for eye protection during a process with a fulminating high light energy. Such a process is for example a welding process and the optical device can be used in welding goggles or in laser goggles to substitute the glass of the goggles.

The invention may best be understood by reference to the following drawings and examples. The following figures and examples are intended to describe certain embodiments of the present invention and should not be interpreted in any manner as limiting the scope of the invention as set forth in the accompanying claims.

BRIEF DESCRIPTION OF THE DRAWINGS

Figures

FIG. 1 A is a cross-sectional view of an optical device.
FIG. 1 B is a schematic view of a switchable layer.
FIGS. 2 A and B is a schematic view of possible alignments of a luminescent material.
FIG. 13 A to C show various one embodiments of the optical device in a window frame.
FIGS. 14 A to C show schematically the function of the optical device in different states.

Figure 1A:
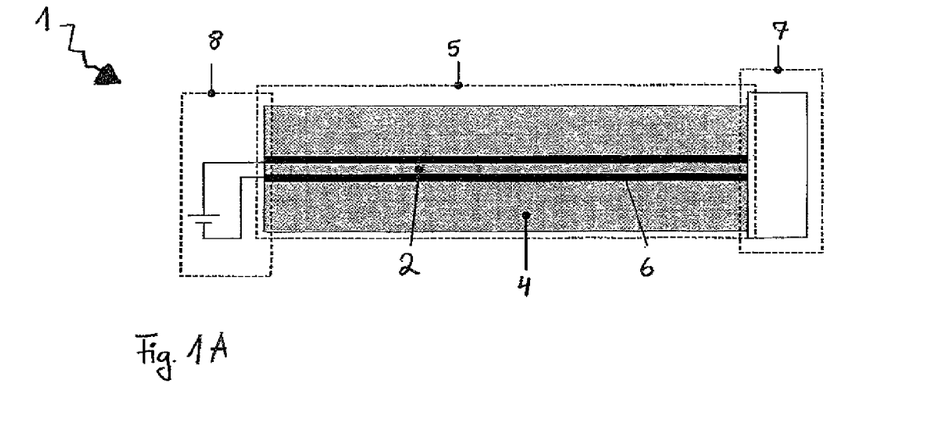

In FIG. 1A a cross-sectional view of an optical device 1 is demonstrated. The optical device comprises a switchable layer 2 with luminescent material 3 (not depicted in FIG. 1), supporting means 4, a light guiding system 5 and an energy converting system 7. The switchable layer 2 in FIG. 1 is a liquid crystal cell, whereas alignment layers 6 are in contact with the inner surface of the cell. Due to a control system 8, the liquid crystal layer is switchable. The light guiding system 5 can be a luminescent solar concentrator. The luminescent solar concentrator (LSC) comprises three main components, namely a dye layer (switchable layer 2 and luminescent material 3), a waveguide (light guiding system 5) and a photovoltaic cell (energy converting system 7). The fluorescent dye layer is used to absorb and re-emit the (sun)light. This layer consists of organic fluorescent dye molecules (luminescent material 3), which absorb the incoming light. The absorbed light is re-emitted again by fluorescence. The efficiency of this re-emission process is termed the quantum efficiency and is in some cases over 90%. The light that is emitted through fluorescence in a direction outside the critical angle with the surface will be trapped in waveguiding modes. The waveguided light can only exit the waveguide at the narrow edge of the waveguide. For geometric reasons, the light that reaches the ends of the waveguides will automatically be inside the critical angle and thus exits. Because the solar concentrator can have a large top surface where light enters, compared to a small side, where the light exits, it is called a 'concentrator': the exiting light is of higher intensity (energy/unit area) than the incoming light. For the waveguiding layer, a high refractive index, transparent layer is used to guide the light towards a photovoltaic cell (energy converting system 7). As the photovoltaic cell is mounted on the narrow side of the waveguide, only a small photovoltaic cell is necessary. Nevertheless, this photovoltaic cell will be exposed to high intensity light and will thus yield considerable current.

Figure 1B:
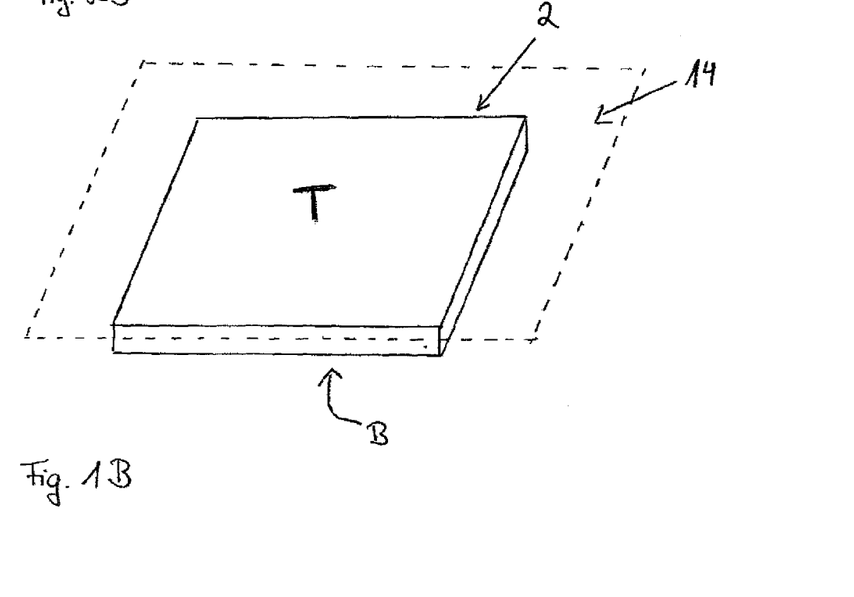

In FIG. 1 B the switchable layer 2 is schematically depicted. The switchable layer 2 has preferably a top-side T and a bottom-side B, whereby top-side T and bottom-side B are parallel to each other. The surfaces of the top-side T and the bottom-side B are much larger than the thickness of the switchable layer 2 perpendicular to the top-side T and the bottom-side B. A plane 14 parallel to the top-side T and the bottom-side B describes therefore the main extension plane 14 of the switchable layer 2. For better understanding the alignment layers 6 are positioned along the top-side T and the bottom-side B and approximately parallel to the top-side T and the bottom-side B. The energy converting system 7 is preferably positioned approximately perpendicular to the top-side T and the bottom-side B. Inside the switchable layer 2 the luminescent material 3 can be aligned approximately parallel (absorption state) or approximately perpendicular (transmitting state) to the top-side A and bottom-side B respectively to the main extension plane 14.

Figure 2A:
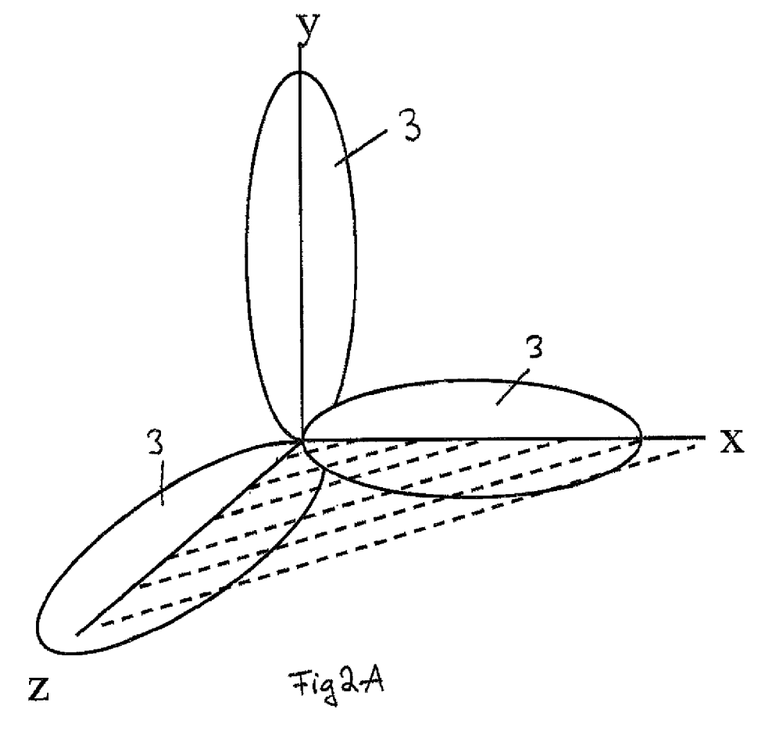
Figure 2B:
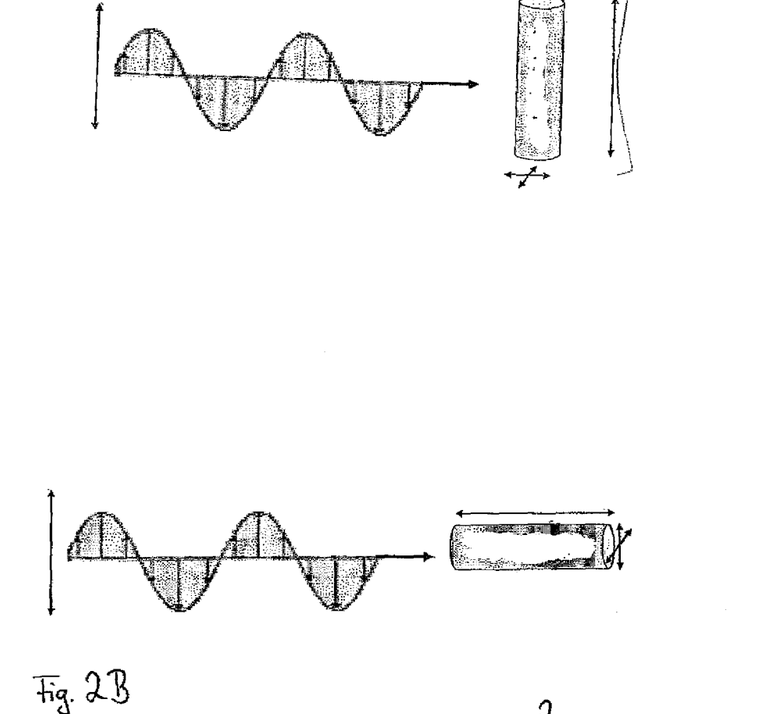

FIG. 2A illustrates the possible positions of the luminescent material 3. In FIG. 2B the correlation between absorption axis of the luminescent material 3, propagation direction of the light and the polarization direction of the electric field (E-field) vector of the incident light is shown. Light can be described as an electromagnetic wave, where the oscillations of the electromagnetic wave are perpendicular to the propagation direction of the light. In linearly polarized light, only a single oscillatory plane of the E-field is presented. The polarization direction is than defined as the oscillatory plane of the E-field of the light. Normal daylight (isotropic light) contains components of all possible polarization directions, whereby all possible polarization direction are equally represented. Therefore isotropic light can be described mathematically as light with two polarization directions, whereby the polarization directions are perpendicular to each other. The luminescent material 3 is a dichroic dye molecule; this means that the molecule shows a stronger absorption in one direction (in the direction of the absorption axis of the molecule) than in another. When the absorption axis of the molecule is perpendicular to the propagation direction of the light, and the polarization state of the light is parallel to the absorption axis of the molecule, the dye molecule will show a high absorption. Another possibility is that the absorption axis of the molecule is perpendicular to the propagation direction of the light and the polarization state of the light is perpendicular to the absorption axis of the molecule. In that case, only a small part of the light will be absorbed. When the molecule is now rotated, such that the propagation direction of the light is parallel to the absorption axis of the molecule, the polarization state of the light will always be perpendicular to the absorption axis of the molecule. This case is shown in FIG. 2A when the luminescent material 3 is aligned parallel to the Y-axis and when the propagation direction of the light is parallel to the Y-axis. If the luminescent material 3 is aligned parallel to the X- or Z-axis and isotropic (or unpolarized) light is used, the luminescent material 3 will have a high absorption for one polarization component of the light, that is, the polarization component that is parallel to the primary absorption axis of the molecule. If a transparent (low absorbing) optical device 1 is desired, the absorption axis of the luminescent material 3 is aligned parallel to the Y-axis and therefore perpendicular to the X-axis and Z-axis and perpendicular to the two mathematically determined polarization states of the isotropic light. For better understanding the main extension plane 14 of the switchable layer 2 is indicated by dashed lines. For a transparent (low absorbing) optical device 1, the absorption axis of the luminescent material 3 is perpendicular to the main extension plane 14 of the switchable layer 2. In the opaque state of the optical device 1, the absorption axis of luminescent material 3 is parallel to the X-axis or Y-axis.

Figure 3:
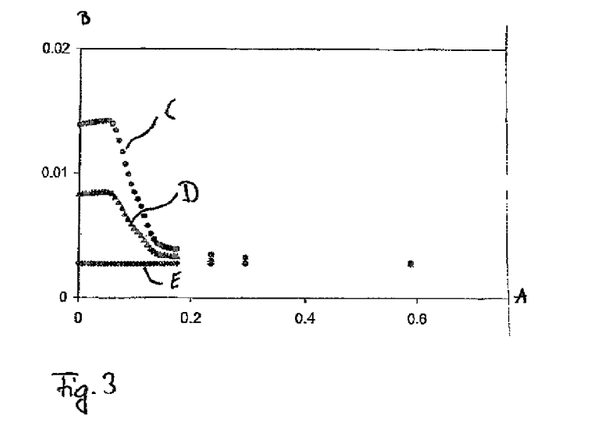
FIG. 3 is a diagram of the correlation between optical density and applied voltage.

In FIG. 3 the correlation between applied voltage and optical density of the optical device is depicted. The A-axis represents the applied voltage in V/m and the B-axis represents the optical density per micrometer. Curve C describes the light with polarization direction parallel to the absorption axis of the luminescent material 3. Curve D describes unpolarized light and curve E light with polarization direction perpendicular to the absorption axis of the luminescent material. When the voltage of the cell (optical device 1) is switched on, the optical density of the cell can be decreased by increasing the voltage.

Figure 13:
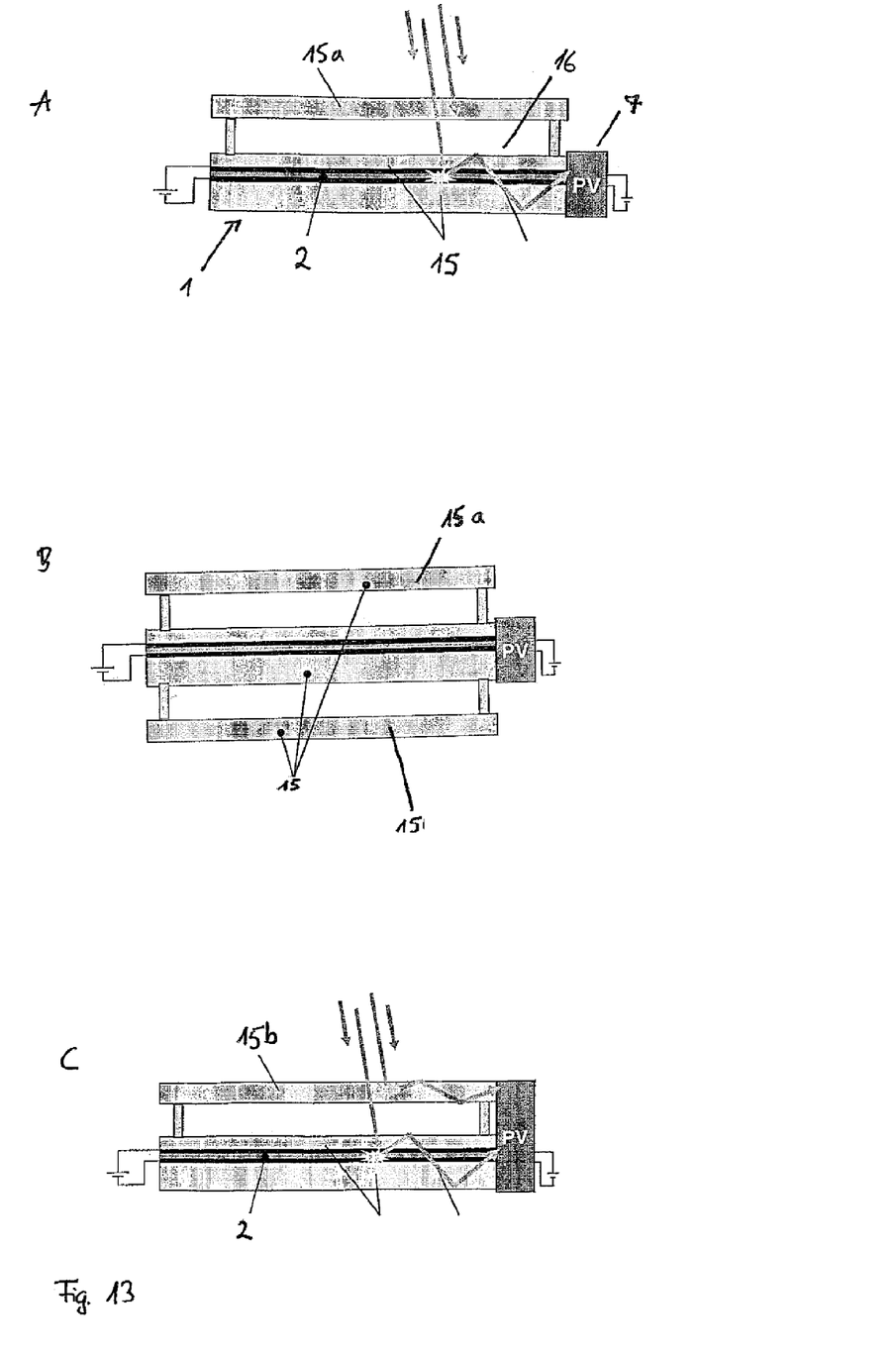
Figure 14:
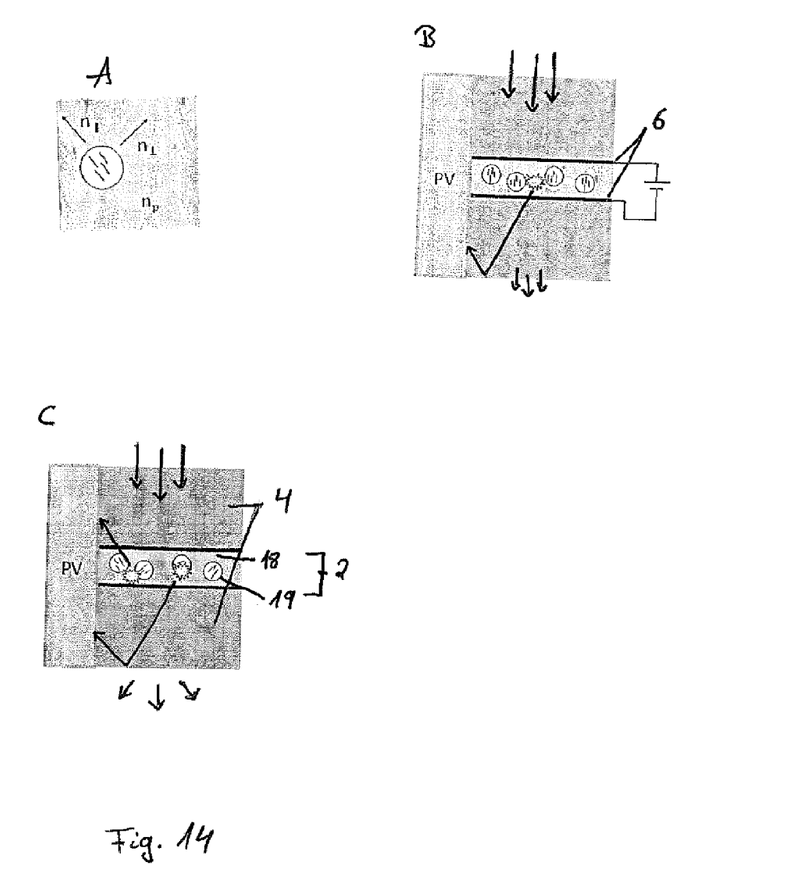

FIG. 14 A to C displays the function of the optical device and FIG. 13 A to C shows a windows frame with optical device.

A polymer dispersed liquid crystal (PDLC) can also be used as the liquid crystal for the optical device according to this invention, for example. PDLC's are well-known and many examples have been published in the literature; see for example J W Doane, "Polymer Dispersed Liquid Crystal Displays" in "Liquid Crystals, Applications and Uses", Editor B Bahadur, World Scientific (1991), P S Drzaic, "Liquid Crystal Dispersions", World Scientific, (1995), D Coates, *J. Mat. Chem.*, 5(12), 2063-2072, (1995).

In a PDLC, the switchable layer consists of a polymer matrix with liquid crystal droplets 19. The liquid crystal 19 in the droplets can be aligned homeotropically using an electric field, as is done in a regular LC display. In most PDLC devices, the refractive index of the polymer matrix 18 ($n_p$) is chosen such that it matches the refractive index of the extraordinary axis of the liquid crystal 19 ($n_\parallel$) and thus mismatches that of the ordinary axis $n_\perp$. When an electrical field is applied via the electrodes—which make up the alignment layer 6—in the 'on' state (shown in FIG. 14B), the LC molecules 19 will be aligned homeotropically. Light travelling in a direction perpendicular to the plane of the switchable layer 2 will therefore not encounter a refractive index change and thus will not be refracted. In the 'off' state (shown in FIG. 14C), the LC molecules 19 will have a random orientation and the light will encounter the refractive index corresponding to the ordinary axis ($n_\perp$) and the polymer 18. As a consequence, the light will be scattered.

In a preferred embodiment a small (0.5 wt-5 wt %) concentration of luminescent material 3 is incorporated in the switchable layer 2 (the polymer matrix 18 and/or the LC droplets 19). The luminescent material 3 could be an anisotropic fluorescent dye that is able to align with the liquid crystal droplets 19, for example BASF Lumogen F Yellow 083. The luminescent material 3 causes a fraction of the light to be absorbed and re-emitted into waveguiding modes. By changing the alignment of the luminescent material 3 that are in the mobile phase (the LC 19), the absorption of light by the luminescent material in the switchable layer 2 is changeable. In the homeotropic 'on' state (FIG. 14B) the absorption is low, while in the 'off' state (FIG. 14C) the absorption by the luminescent material is high. Light that is emitted or scattered may be trapped in waveguiding modes in the optical device 1. The waveguided light can then be converted into electrical energy by an energy converting system 7, for example a photovoltaic element (PV), that is mounted to the side of the waveguide 'sandwich'. The scattering of the light in the switchable layer 2 in the "off" state may increase the amount of light travelling through waveguide over short distances, but will decrease the amount of light that is transport through the waveguide over large distances.

There are a number of methods known to produce PDLC's, including polymerization induced phase separation (PIPS), temperature induced phase separation (TIPS) and solvent induced phase separation (SIPS). Here the PIPS method will be described but the other method may also produce the same device.

The manufacturing starts using a homogeneous mixture of reactive monomers (e.g. an acrylate or thiol-ene system) and liquid crystal. Suitable commercially available materials are Norland Optical Adhesive NOA 65 as prepolymer in a 50:50 weight ratio with the liquid crystal mixture BL03 (Merck). Alternatively, the prepolymer Merck Licrilite PN 393 may be used in 20:80 weight ratio with Merck TL203 liquid crystal mixture. The luminescent material 3 is homogeneously dissolved or dispersed into the mixture.

Further preparation steps follow the traditional preparation of a PDLC mixture, which is known in the art and consists of:
- Providing two substrates (polymer or glass panes) coated with a transparent conductor
- Applying the mixture on the substrate(s)
- Ensuring the correct thickness of the mixture on the substrate(s), either by bar coating or doctor blade coating or using a glass cell employing spacers
- Exposing the mixture to UV light of controlled dosage and under controlled temperature conditions such that phase separation occurs
- Optionally including a post curing step Optimal scattering occurs when drop sizes are 1-2 µm. The clarity of the optical device 1—for example a window—in the 'on' state depends on the amount of liquid crystal material phase separated out of the pre-polymer mixture. Film thicknesses may vary but are typically 10-40 µm. The system may be switched by applying a voltage (AC) over the film.

Many variations of PDLC systems are known to those skilled in the art; most importantly, reverse mode PDLCs that switch from transparent in their 'off' state to opaque in their 'on' state.

In one embodiment, the optical device 1 is integrated into a window and frame configuration (shown in FIG. 13 A to C), where the optical device 1 is part of the double or triple glazed window (see FIGS. 13A and 13B). The not-switchable glass pane is preferably located to the side from which the majority of the light is incident (the outside). Optical functionality, such as a UV filter or NIR filter, may be built into this first glass layer 15a. In this way, the optical device 1 may be shielded from harmful radiation and additional control over the incoming radiation is achieved. In between the first glass layer 15a and the optical device 1 is a material with low heat conductivity employed, such as gasses (air, argon) or liquids or solids, with the purpose of acting as an insulating layer 16. This insulating layer 16 increases the resistance of the window to thermal conduction between the inside and the outside. In FIGS. 13A and 13B, the energy converting system 7 (photovoltaic element) is drawn on one side of the glass 15, but can be on any side of the glass 15.

In a second embodiment (FIG. 13C), a second static (i.e. not switchable) layer 15b is a luminescent solar concentrator. Luminescent solar concentrators are well known in the art; see for example Van Sark et al. in OPTICS EXPRESS, December 2008, Vol. 16, No. 26, 2177322. In this embodiment, it is beneficial to optically connect the energy converting system 7 (photovoltaic element) to the glass 15 and the second static layer 15b.

EXAMPLES

Example 1

Figure 12:
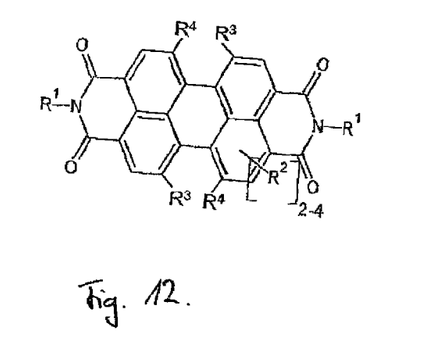
FIG. 12 shows a general structure of a luminescent material.

1. A commercial glass liquid crystal cell is obtained, for example from Linkam Scientific Instruments or from Instec Inc. The liquid crystal cell has transparent electrodes on the inner surface, for example based on a thin (100 nm) layer of ITO (indium tin oxide). The cell gap between the top and bottom cover of the glass cell is 20 µm.
2. The inside surfaces of the glass cell are treated with an optically transparent alignment layer. This alignment layer can be rubbed polyimide, for example Nissan Chemical Industries polyimide, grade 130. The polyimide layer has been rubbed with a cloth to obtain uniaxial planar alignment.
3. The fluorescent liquid crystal mixture is prepared by mixing a small concentration (0.1 wt %) of fluorescent perylene dye, BASF Lumogen F Yellow 170, with liquid crystal mixture E7 (Merck). This fluorescent dye represents in this embodiment the luminescent material. The general structure of the perylene dyes is given in FIG. 12.
4. The cell is then filled by feeding a small amount of the fluorescent liquid crystal mixture to an open side of the glass cell. The cell fills under capillary action.
5. A photovoltaic cell is used as energy converting system and optically attached to the side of the glass using an optical adhesive that matches the refractive index of the glass, for example Norland UVS 91. The photovoltaic cell faces towards the glass waveguide.
6. A regulated voltage source is attached to the electrodes. The controlled voltage source can supply an alternating current (AC), with sinusoidal or block profile, with a frequency between 10 and 10 000 Hz, preferably 1 kHz.

Figure 9:
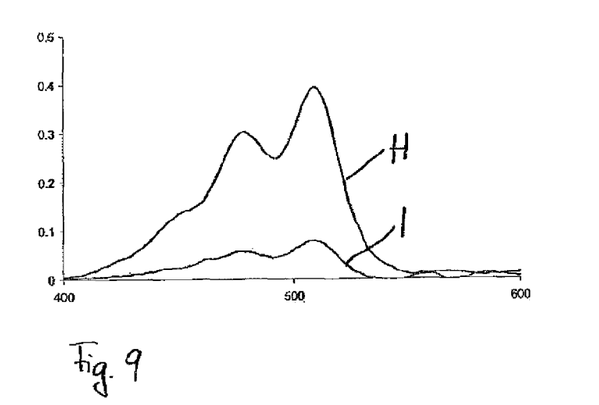
FIG. 9 is a diagram of optical densities.

Oriented Lumogen F 170 shows a strong dichroism in absorption; it has a higher optical density for light with polarization direction parallel to the long axis of the molecule than for light with polarization direction perpendicular to the long axis of the molecule. The measured dichroism of a planar anti-parallel cell filled with a 0.1 wt % Lumogen F 170 dissolved in E7 host shows a dichroic ratio of 5.1. In FIG. 9 the dichroism properties (optical density depending on the wavelength) of the Lumogen F 170 are illustrated. Curve H demonstrates the parallel and curve I the perpendicularly polarized light.

Figure 4:
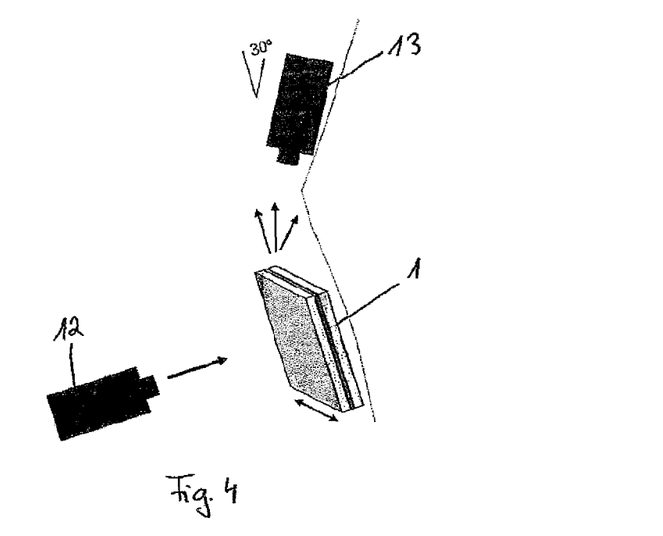
FIGS. 4 and 5 shows experimental set ups.

In FIG. 4 a measurement method for the absorbed, emitted and guided light is depicted. The relative light output on the side of the glass cell was measured as a function of voltage. Light is observed by a photo-detector (13), whereby the light is emitted by a light source (12) and—after entering the optical device (1)—coupled out of the light guides. Here, the lightguides are observed by the photo-detector (13) at an angle of 30 degrees to the plane of the cell. The spectral output of the concentrated light closely matches the fluorescence spectrum of the dye molecule. Further evidence of correct operation of the solar concentrator comes from increasing/decreasing the voltage; when the voltage is increased the optical density of the cell decreases, the output at the edge of the cell increases. This demonstrates that the output of the concentrator is directly related to the optical density of the cell.

Figure 6:
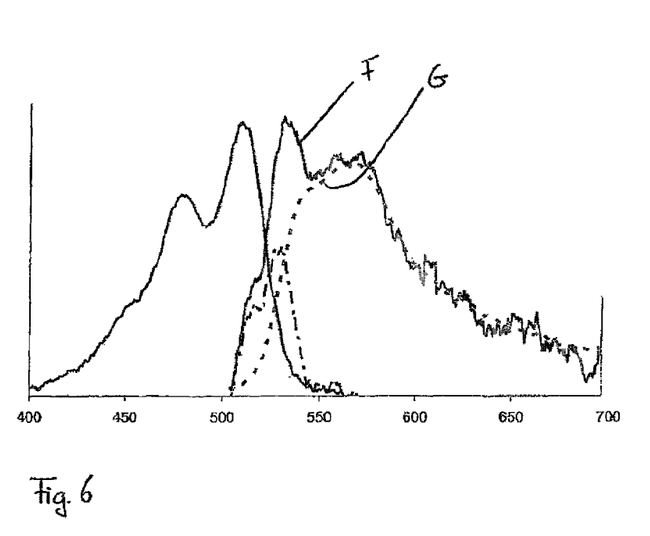
FIG. 6 is a diagram of an absorption and fluorescence spectral profile.
Figure 11:
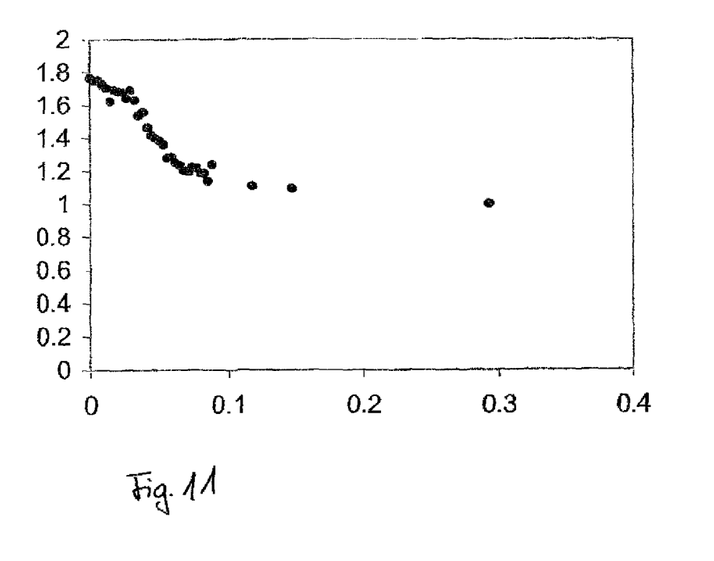
FIG. 11 is a diagram of a concentrated light output at the side of an optical device.

The spectral output of the concentrated light closely matches the fluorescence spectrum of the dye. FIG. 6 shows the profile of the absorption spectrum of the dye, the fluorescence spectrum (F) and the spectrum (G) of the light exiting from the side of the cell. The difference between the concentrated light and the fluorescence spectrum is also indicated and is attributed to light re-absorption of the dye. This demonstrates that the window (as example for an optical device) indeed functions as a fluorescent concentrator. Further evidence of correct operation of the solar concentrator comes from increasing/decreasing the voltage; when the voltage is increased the optical density of the cell decreases, the output at the edge of the cell increases. This demonstrates that the output of the concentrator is directly related to the optical density of the cell. This is demonstrated in FIG. 11, whereby the intensity dependence with the electrical field (V/µm) is depicted.

Example 2

The same approach is followed as approach 1. At step 3, a small amount of a chirality-inducing agent (a chiral dopant) is added.

3. With the liquid crystal and fluorescent dyes as described in example 1, Merck CB15 is added in 2-10 wt % to the mix. Alternatively, chiral dopant S-811 or IS-4651 is used such that the desired number of twists is achieved over the thickness of the cell. Preferentially, the director rotates at least 270° over the cell thickness.
4. The cell is filled.
5. A photovoltaic cell is optically attached to the side of the glass using an optical adhesive, for example Norland UVS 91.

Figure 7:
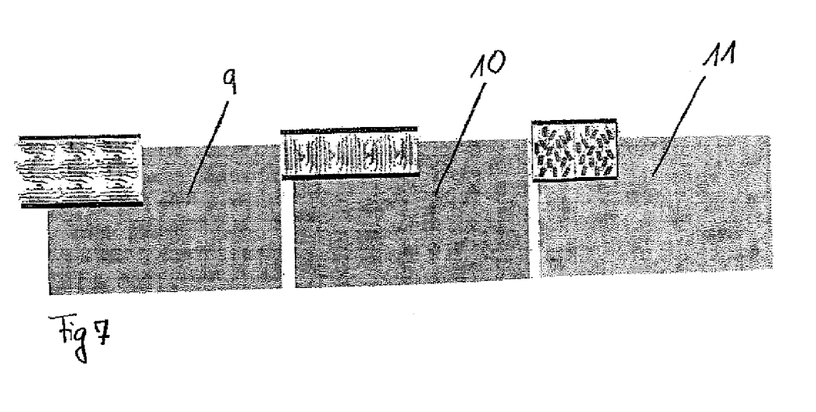
FIG. 7 shows microscopy images of a dark (opaque), a scattering and a bright (transmission) mode.

A regulated voltage source is attached to the electrodes. The controlled voltage source can supply an AC with sinusoidal or block profile, with a frequency between 10 and 10 000 Hz, preferably 1 kHz. In-between the high absorbing state at low voltages and the low absorbing state at high voltages, the window now exhibits a scattering state at intermediate voltages caused by a 'fingerprint' alignment of the liquid crystal. In all states, the window is able to act as a luminescent solar concentrator and collects light. FIG. 7 shows microscopy images of the dark mode (9), scattering mode (10) and bright window mode (11), where the voltage increases from left to right. The insets schematically show the molecular alignment for that state. In the dark mode all liquid crystal molecules have the molecular axis in the plane of the switchable layer. Moreover, the liquid crystal molecules have a chiral nematic ordering. This means that through the thickness of the switchable layer the direction of the molecular axis, the director, rotates in the plane. For rod-like liquid crystals, this rotation thus describes a helix, with the helical axis perpendicular to the plane of the switchable layer. The alignment of the luminescent material follows the alignment of the host liquid crystal and will thus also describe a rotation through the thickness of the switchable layer.

In the scattering mode, the helical axis is tilted by 90°, such that the director rotation is now in the plane of the switchable layer. This causes a modulation of the refractive index in the plane with a periodicity of a half rotation of the molecular director. This modulation causes scattering of the light that is transmitted through the switchable layer. In this case, the luminescent perylene dye Lumogen F is organized in a helical fashion in the plane of the switchable layer. Orientations of the absorption axis of the molecule parallel and perpendicular to the plane are thus both present.

In the transparent mode, all the molecules are aligned perpendicular by the plane of the switchable layer and no chiral organization of the liquid crystals is allowed.

Example 3

The same approach is followed as in example 1. At step 2, the molecular alignment layer is now chosen differently.

2. The inside surfaces of the glass cell are treated with an optically transparent alignment layer. At least one of the two substrates provides homeotropic alignment (the angle of the molecular director with the substrate is approximately 90°). Examples of this alignment layer are Polyimide Grade 5300, Polyimide Grade 1211 from Nissan Chemical or JALS-204 polyimide from JSR. In all cases, this polyimide layer is lightly rubbed to provide an alignment offset a few degrees (typically 2°) from the normal.
3. A fluorescent liquid crystal mix is prepared using a liquid crystal with a negative dielectric anisotropy, for example LC mixture MLC 6610 (Merck) having a di-electric anisotropy of −3.1 or AMLC-0010 (AlphaMicron), having a di-electric anisotropy of −3.7. A small concentration (typically 0.1 wt %) of fluorescent dye is added to the mixture.
4. The cell is then filled by feeding small amount of the fluorescent liquid crystal mixture to an open side of the glass cell. The cell fills under capillary action.
5. A photovoltaic cell is optically attached to the side of the glass using an optical adhesive, for example Norland UVS 91.
6. A regulated voltage source is attached to the electrodes. The controlled voltage source can supply an AC current, with sinusoidal or block profile, with a frequency between 10 and 10 000 Hz, preferably 1 kHz.

At zero or low voltage, this window is in high transmission state. When the voltage over the transparent electrodes is increased, a scattering state appears. At high voltages, the dark state appears. In all states, the photovoltaic cell collects sunlight which is converted into electrical energy.

Figure 8:
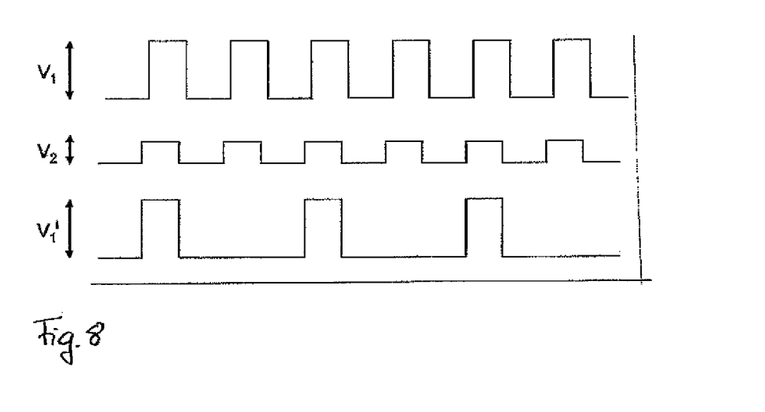
FIG. 8 shows different examples of voltage profiles.

In FIG. 8 an example of control signals 1 to 3 is shown. The signals depicted here are block signals; these could also be sinusoidal, sawtooth or trapezoidal signals. Upon application of signal V1 the light guiding system respectively the optical device has high transmission or low transmission properties. By applying the signal V2 the optical device has scattering properties. By applying signal V1' the optical device has also scattering properties. Without an applied voltage the optical device has a low transmission or a high transmission.

Comparative Example

Figure 5:
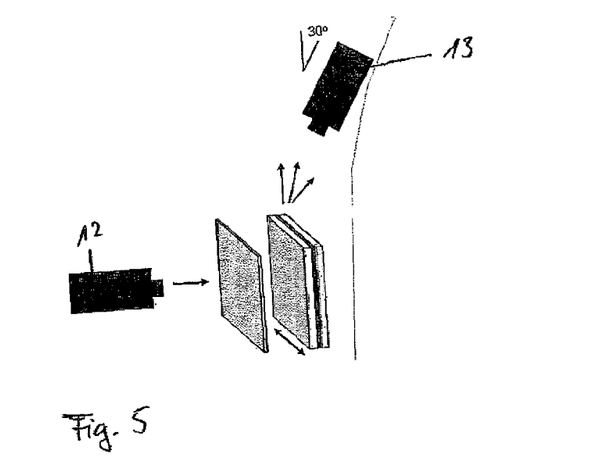

To compare the approach described here with the approach described in document DE 33 30 305 A1, 'Fenster', a comparative measurement was performed to demonstrate the functioning of the device as a solar concentrator. Following the approach in document DE 33 30 305 A1 a liquid crystal cell was prepared with a LC mixture containing a small amount (0.2 wt %) fluorescent dye (BASF Lumogen Blau 650). Three experiments were performed to compare the performance of the device as a solar concentrator. In all of the experiments, the concentrated light output of the cell was measured in the dark (absorbing) state, which corresponds to the state with the highest amount of light output from the cell edge. The output was measured using a Melchers Autronic, where the detector is focused on the edge of the cell. FIG. 5 schematically shows the set-up used in the measurement.

Description of the Experiment (Comparative Example):
1. Following the patent DE 33 30 305 A1, the polarizer was placed with the polarization direction perpendicular to the alignment of the liquid crystal.
2. As a small variation on patent DE 33 30 305 A1, the polarizer was placed with the polarization direction parallel to the alignment of the liquid crystal.
3. Following the approach described in example 1, the polarizer was removed.

Figure 10:
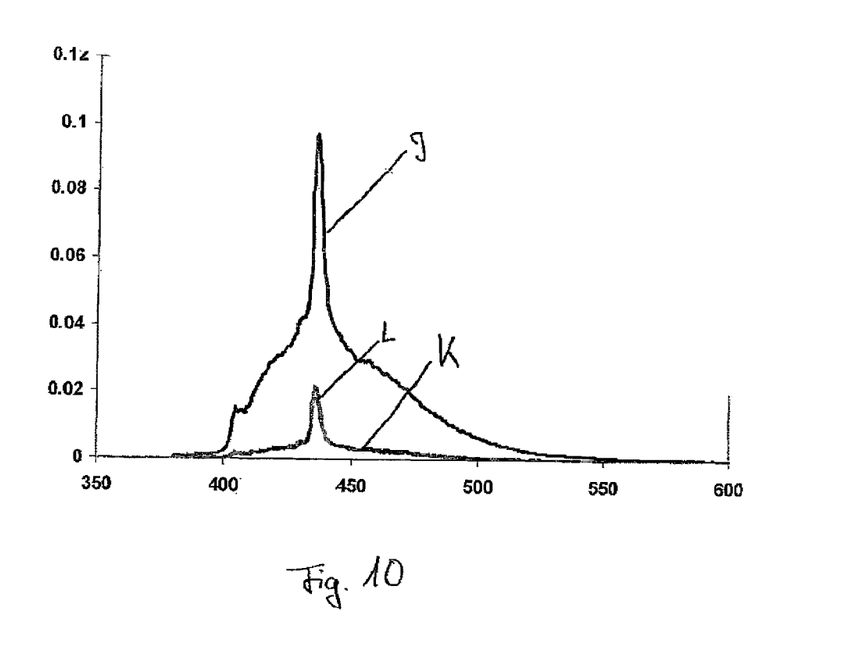
FIG. 10 is a diagram of a spectral intensity of an optical device.

The results are shown in FIG. 10 whereby the spectral radiance depending of the wavelength is shown: The device layout as described in document DE 33 30 305 A1 has the lowest output at the side of the cell (curve L). When the polarizer is rotated 90°, the output increases slightly (curve K). When there is no polarizer present (curve J), following the working example 1 from this document, the concentrated light output from the window is a factor 5 higher.

REFERENCE NUMBERS 1 optical device
2 switchable layer
3 luminescent material
4 supporting means
5 light guiding system
6 alignment layer
7 energy converting system
8 control system
9 dark mode
10 scattering mode
11 bright window mode
12 (light) source
13 detector
14 main extension plane (switchable layer 2)
15 glass
15a first glass layer
15b second static layer
16 insolating layer
18 polymer matrix
19 liquid crystal/liquid crystal droplets
T top-side
B bottom-side
A axis
B axis
C curve
D curve
E curve
G curve
H curve
I curve
J curve
K curve
L curve

The invention claimed is:

1. An optical device comprising a window, the window including:
    a switchable layer;
    at least one alignment layer; and
    a light guiding system;
    wherein the switchable layer comprises a luminescent material for absorbing and emitting light, whereby the alignment of the luminescent material is changeable and the light guiding system guides the emitted light, whereby the switchable layer is in contact with the at least one alignment layer and the luminescent material exhibits anisotropic properties, and
    wherein the window further comprises a light energy-converting means and the light energy-converting means is one or more photovoltaic cell and/or a photo-thermal converter, wherein the light guiding system is in physical contact with the light energy-converting means.

2. An optical device according to claim 1, wherein the luminescent material exhibits dichroism properties.

3. An optical device according to claim 1, wherein the luminescent material is a fluorescent dye.

4. An optical device according to claim 1, wherein the emitted light is guided in the light guiding system via total internal reflection.

5. An optical device according to claim 1, wherein the window comprises one or more supporting means, wherein the supporting means is panel shaped and the energy-converting means is arranged on one or more sides of the supporting means and perpendicular to the main extension of the supporting means.

6. An optical device according to claim 1, wherein the luminescent material is aligned in an absorbing state or in a transmitting state.

7. An optical device according to claim 1, wherein the luminescent material is aligned in one or more scattering states.

8. An optical device according to claim 1, wherein in all states of the luminescent material, light is absorbed and emitted by the luminescent material and guided in the light guiding system via total internal reflection to the light energy-converting means.

9. An optical device according to claim 6, wherein in the transmitting state, an absorption axis of the luminescent material is arranged perpendicular to a main extension plane of the switchable layer.

10. An optical device according to claim 1, wherein the light guiding system comprises one or more wavelength-selective mirrors.

11. An optical device according to claim 5, wherein the supporting means comprises glass or polymer panes.

* * * * *